US006539065B1

(12) United States Patent
Furukawa

(10) Patent No.: US 6,539,065 B1
(45) Date of Patent: Mar. 25, 2003

(54) DIGITAL AUDIO BROADCASTING RECEIVER

(75) Inventor: Hiroki Furukawa, Osaka (JP)

(73) Assignee: Matsushita Electric Industrial Co., Ltd., Kadoma (JP)

( * ) Notice: Subject to any disclaimer, the term of this patent is extended or adjusted under 35 U.S.C. 154(b) by 0 days.

(21) Appl. No.: 09/407,925

(22) Filed: Sep. 29, 1999

(30) Foreign Application Priority Data

Sep. 30, 1998 (JP) .......................................... 10-278895

(51) Int. Cl.[7] .......................... H03K 9/00; H04L 27/06; H04L 27/14; H04L 25/06

(52) U.S. Cl. ....................................... 375/316; 375/259

(58) Field of Search ................................ 375/316, 259, 375/260, 340, 324, 295; 370/206

(56) References Cited

U.S. PATENT DOCUMENTS 6,067,332 A * 5/2000 Taura et al. ................ 375/344
6,192,056 B1 * 2/2001 Tsuruoka .................... 370/208
6,275,551 B1 * 8/2001 Nomura et al. ............. 375/344
6,341,123 B1 * 1/2002 Tsujishita et al. ........... 370/210

FOREIGN PATENT DOCUMENTS

EP 0 829 988 3/1998
EP 0 963 068 12/1999
JP 10126353 5/1998
WO 97/07620 2/1997

OTHER PUBLICATIONS

European Search Report regarding Application No. 99119301.2–2219 dated Nov. 5, 2001.

*EBU Technical Review*, Winter 1993, pp. 25–35, F. van de Laar, N. Philips, R. Olde Dubbelink, "General—purpose and application—specific design of a DAB channel decoder".

* cited by examiner

*Primary Examiner*—Jean Corrielus
(74) *Attorney, Agent, or Firm*—Renner, Otto, Boisselle & Sklar

(57) ABSTRACT

A digital audio broadcasting receiver includes: an analog-digital converter for converting a plurality of transfer frames from an analog signal format into a digital signal format based on a clock signal having a fixed frequency and for outputting the first transfer frame; a demodulator for demodulating the first transfer frame from a first frame processing start position for the first transfer frame; an audio decoder for generating audio data containing a plurality of audio samples based on the data symbol contained in the first transfer frame which has been demodulated by the demodulator; a transfer path characteristics calculator for generating a transfer path characteristics signal representing transfer path characteristics based on the reference symbol contained in the first transfer frame which has been demodulated by the demodulator; and a frame processing start position control section for controlling a second frame processing start position for the second transfer frame, by outputting to the demodulator a position control signal representing a difference between a predetermined frame processing reference start position and the first frame processing start position for the first transfer frame based on the transfer path characteristics signal, so that the second frame processing start position for the second transfer frame coincides with the predetermined frame processing reference start position.

7 Claims, 9 Drawing Sheets

Receiver clock is slower than transmitter clock

Receiver clock is faster than transmitter clock

Characteristics of 1st and 2nd variable gain amplifiers for ADDR2

DIGITAL AUDIO BROADCASTING RECEIVER

BACKGROUND OF THE INVENTION

1. Field of the Invention

The present invention relates to a digital audio broadcasting receiver. In particular, the present invention relates to a digital audio broadcast receiver for receiving digital audio broadcast signals, e.g., Eureka 147 digital audio broadcasting (DAB).

2. Description of the Related Art

Conventional digital audio broadcasting receivers have been proposed that are compatible with Eureka 147 DAB system based on an OFDM (orthogonal frequency division multiplex) method, as disclosed in General-purpose and application-specific design of a DAB channel decoder, EBU Technical Review Winter 1993, pp.25–35 and Japanese Laid-Open Publication No. 10-126353.

FIG. 9 illustrates a conventional digital audio broadcasting receiver 2000 based on the OFDM method, which includes an RF circuit 100 for converting a radiofrequency signal received from a digital audio broadcast transmitter into an analog base band signal; an analog-digital (AD) converter 101 for converting the analog base band signal into a digital base band signal via sampling; a null symbol detector 102 for detecting a null symbol from the power envelope of the analog base band signal for determining a position at which to start frame processing for the first transfer frame at the time of receiving; an OFDM demodulator 103 for subjecting each symbol to OFDM demodulation by sequentially extracting, with a predetermined symbol cycle, a predetermined number of samples of null symbols, reference symbols, and data symbols from the digital base band signal which is output from the AD converter 101 and sequentially applying FFT (fast Fourier transform) thereto; a digital demodulator 104 for subjecting the output from the OFDM demodulator 103 to a π/4 shift DQPSK (differential quadriphase phase shift keying) demodulation; an error correction circuit 105 for performing error correction for the output of the digital demodulator 104; and an audio decoder 106 for extracting from the output of the error correction circuit 105 the audio data which has been compressed on the transmitter side and expanding the audio data into a PCM signal so as to generate audio data which contains plurality of audio samples. The audio data which is output from the audio decoder 106 is reproduced by an audio reproducer (not shown) into sounds.

The conventional digital audio broadcasting receiver 2000 further includes a CIR calculator 107 for calculating the power characteristics of a channel impulse response (hereinafter "CIR") of a transfer path based on the result of the FFT performed for the reference symbols; a VCXO controller 108 for detecting a difference in frequency between the clock signal on the transmitter side and the clock signal on the receiver side based on the calculation results by the CIR calculator 107 for controlling the voltage for a voltage controlled crystal oscillator (hereinafter "VCXO") on the receiver side so as to equalize the clock signal on the receiver side to the clock signal on the transmitter side; a digital-analog (DA) converter 109 for converting the control data from the VCXO controller 108 into an analog signal; a VCXO 110 which is capable of oscillating at various frequencies in accordance with a control voltage that is based on the output from the DA converter 109; and an AD clock signal generator 111 for dividing the clock signal for the VCXO 110 so as to generate a sampling clock signal that defines the sampling cycle of the AD converter 101.

As shown in FIG. 10, one transfer frame TF includes a null symbol TFN which has a very low signal level for indicating the start position of a transfer frame; a reference symbol TFR containing known information; and a plurality of data symbols TFD which represent data for transfer. The digital audio broadcasting receiver 2000 is operable, when starting reception, so as to start a FFT process responsive to the OFDM demodulator 103 receiving the null symbol detection signal from the null symbol detector 102 via a switch 120 which may be controlled by a CPU (not shown). The null symbol TFN, reference symbol TFR, and data symbol TFD which have been output from the AD converter 101 are sequentially subjected to FFT processes by the OFDM demodulator 103, preferably from a central portion of a guard interval of the null symbol TFN, at intervals corresponding to symbols (TFN, TFR, TFD). The reference symbol which has been subjected to the FFT process by the OFDM demodulator 103 and converted into a frequency signal is sent to the CIR calculator 107. In the CIR calculator 107, the reference symbol is multiplied by a conjugate complex number of a known reference symbol, and its result is subjected to an IFFT (inversion fast Fourier transform), whereby the channel impulse response (CIR), which represents the transfer path characteristics along the time axis, is calculated. By calculating the CIR power characteristics, the temporal relationships between a plurality of received waves, e.g., a direct wave and reflected waves, can be known.

As shown in FIG. 11, a direct wave 1101 and reflected waves 1102 are detected from the CIR power characteristics. As shown in FIG. 10, each symbol (TFN, TFR, TFD) has a guard interval (GI) at the beginning for attaining tolerance for the reflected waves 1102. A guard interval GI is a copy of the last ¼ of each symbol (TFN, TFR, TFD) excluding the guard interval GI. Accordingly, the number of samples of each symbol (TFN, TFR, TFD) is 5/4 times as many as the number of samples to be subjected to FFT.

If any reflected waves 1102 are present, the reflected waves 1102 will interfere with a subsequent symbol because the reflected waves 1102 will be delayed behind the direct wave 1101. Accordingly, the OFDM demodulator 103 applies FFT to subsequent symbols so as to ensure that they do not contain any delayed components of preceding symbols, thereby reducing inter-symbol interference and enabling substantially error-free reception. By utilizing the fact that each symbol has a length which is 5/4 times the number of samples which need to be subjected to FFT, the FFT may be performed for a portion extracted from the center of the guard interval GI such that no reflected waves 1102 due to any preceding symbol are contained in that portion. As a result, at least those delayed waves which are within ½ of the guard interval length are prevented from interfering with subsequent symbols.

In order to ensure that the center of gravity of the CIR power characteristics shown in FIG. 10 is located at the center of the guard interval GI, the VCXO controller 108 controls the clock for the VCXO 110 in the following manner: If the center of the guard interval GI is located temporally before a point which corresponds to ½ of the guard interval GI, then the FFT will be performed for a portion which is extracted too late; therefore, the clock for the VCXO 110 is made faster so that an adequately "earlier" portion is extracted. Conversely, if the center of the guard interval GI is located temporally after a point which corresponds to ½ of the guard interval GI, then the FFT will be performed for a portion which is extracted too early; therefore, the clock for the VCXO 110 is made slower so that an adequately "later" portion is extracted. If the first impulse coincides with the center of the guard interval GI, then at least those delayed waves which are within ½ of the guard interval length are prevented from causing intersymbol interference.

Thus, by controlling so that the impulse position in the CIR power characteristics coincides with the center of the guard interval GI, intersymbol interference due to reflected waves 1102 can be suppressed. Also, the fixed impulse position means the same DAB transfer frame length for both transmission and reception, which in turn means stable reproduction of audio signals due to synchronization of the receiver-side audio reproduction clock signal with the transmitter-side clock signal.

However, the above-described structure requires the VCXO 110 capable of oscillating at various frequencies and the DA converter 109 for outputting a voltage to be supplied to the VCXO 110 in order to achieve synchronization of the receiver-side clock signal with the transmitter-side clock signal, and these elements can lead to an increase in the manufacturing cost of the digital audio broadcasting receiver. On the other hand, omitting the VCXO 110 that is capable of oscillating at various frequencies and employing instead an oscillator capable of oscillating at a fixed frequency for controlling the digital audio broadcasting receiver would allow any mismatch between the clock signals on the transmitter side and on the receiver side to be reflected in a mismatch between the sampling clock signals (for obtaining audio samples) on the transmitter side and on the receiver side, which hinders synchronization of the receiver-side audio reproduction with the transmitter-side clock signal. For example, if the receiver-side clock signal is faster than the transmitter-side clock signal, audio samples to be reproduced will be depleted, resulting in a disruption in the reproduced sound. On the other hand, if the receiver-side clock signal is slower than the transmitter-side clock signal, the audio decoding processing will lag behind so that some samples may not be appropriately reproduced. In either case, problems such as noise generation may occur.

SUMMARY OF THE INVENTION

According to the present invention, there is provided a digital audio broadcasting receiver for receiving a plurality of transfer frames including a first transfer frame and a second transfer frame subsequent to the first transfer frame, each of the plurality of transfer frames containing a null symbol representing a start position of each transfer frame, a reference symbol representing known information, and a data symbol representing data to be transferred, wherein each of the null symbol, the reference symbol, and the data symbol includes a guard interval for preventing intersymbol interference due to a reflected wave, wherein the digital audio broadcasting receiver includes: an analog-digital converter for converting the plurality of transfer frames from an analog signal format into a digital signal format based on a clock signal having a fixed frequency and for outputting the first transfer frame; a demodulator for demodulating the first transfer frame from a first frame processing start position for the first transfer frame; an audio decoder for generating audio data containing a plurality of audio samples based on the data symbol contained in the first transfer frame which has been demodulated by the demodulator; a transfer path characteristics calculator for generating a transfer path characteristics signal representing transfer path characteristics based on the reference symbol contained in the first transfer frame which has been demodulated by the demodulator; a frame processing start position control section for controlling a second frame processing start position for the second transfer frame, by outputting to the demodulator a position control signal representing a difference between a predetermined frame processing reference start position and the first frame processing start position for the first transfer frame based on the transfer path characteristics signal, so that the second frame processing start position for the second transfer frame coincides with the predetermined frame processing reference start position; an audio sample discrepancy calculation section for calculating a discrepancy between a plurality of audio samples contained in audio data to be transmitted by a digital audio transmitter and the plurality of audio samples contained in the audio data generated by the audio decoder based on the position control signal; an audio sample adjustment section for adjusting the number of audio samples contained in the audio data generated by the audio decoder, based on the audio sample discrepancy, and for selectively outputting audio reproduction data; and an audio reproducer for reproducing a sound based on the audio reproduction data which is output from the audio sample adjustment section.

In another embodiment of the invention, the demodulator includes an orthogonal frequency division multiplex demodulator for applying fast Fourier transform to the null symbol, the reference symbol, and the data symbol contained in the plurality of transfer frames, and the transfer path characteristics calculator includes a channel impulse response calculator for generating a channel impulse response power characteristics signal, the channel impulse response power characteristics signal being the transfer path characteristics signal.

In still another embodiment of the invention, the predetermined frame processing reference start position is a predetermined position within the guard interval of the null symbol.

In still another embodiment of the invention, the analog-digital converter converts the plurality of transfer frames from an analog signal format into the digital signal format through sampling with a sampling cycle based on the clock signal having the fixed frequency, and the audio sample discrepancy calculation section includes: a total sample number memory section for storing a total number of samples which have been sampled by the analog-digital converter with the sampling cycle for a predetermined period, the total number of samples corresponding to a difference between the predetermined frame processing reference start position and the first frame processing start position; a sample number conversion section for converting at least some of the total number of samples stored in the total sample number memory section into a number of audio samples, whereby the audio sample discrepancy is calculated; and a total sample number correction section for correcting the total number of samples stored in the total sample number memory section by outputting at least some of the total number of samples after having been converted by the sample number conversion section to the total sample number memory section.

In still another embodiment of the invention, the audio sample adjustment section includes at least one sample adjuster corresponding to at least one of monaural reproduction, stereo reproduction, and multi-channel reproduction, each of the at least one sample adjuster including: an input buffer for storing a predetermined number of audio samples among the audio samples contained in the audio data generated by the audio decoder; a cross-fade processing section for reading the predetermined number of audio samples stored in the input buffer, for performing insertion or deletion of the predetermined number of audio samples with cross-fading, and for generating compensated audio data; a sample adjustment controller for determining a number of audio samples to be inserted or deleted in one process by the cross-fade processing section; and an output selector for selectively outputting the predetermined number of audio samples stored in the input buffer when performing neither insertion nor deletion of audio samples, and selectively outputting the compensated audio data generated by the cross-fade processing section when performing insertion or deletion of audio samples.

In still another embodiment of the invention, the cross-fade processing section includes: a first variable gain amplifier and a second variable gain amplifier; a gain controller for controlling a gain of the first variable gain amplifier and a gain of the second variable gain amplifier; an adder for adding outputs of the first variable gain amplifier and the second variable gain amplifier; and an address generator for generating two addresses for audio samples to be input to the first variable gain amplifier and the second variable gain amplifier for insertion or deletion of the number of audio samples determined by the sample adjustment controller, the two addresses being output to the input buffer, and the gain controller controls the gain of the first variable gain amplifier so as to take a large value first and then gradually decrease and controls the gain of the second variable gain amplifier so as to take a small value first and then gradually increase.

In still another embodiment of the invention, when the sample adjustment controller performs insertion or deletion of a plurality of audio samples, the insertion or deletion is performed at a plurality of times, with predetermined time intervals therebetween, so that one audio sample is inserted or deleted each time.

Thus, according to the present invention, a plurality of transfer frames are converted from an analog signal format into a digital signal format in accordance with a clock signal having a fixed frequency, thereby obviating a VCXO (voltage controlled crystal oscillator) which has conventionally been required for analog-digital conversion. As a result, the manufacturing cost for the digital audio broadcasting receiver according to the present invention can be reduced. Nonetheless, each symbol can be demodulated satisfactorily by controlling a position from which to start demodulation for a transfer frame by means of a frame processing start position controlling section so as to minimize the offset in the position from which to start demodulation for a transfer frame. Furthermore, an audio sample discrepancy due to non-synchronization between a transmitter-side clock signal and a receiver-side clock signal can be compensated for by an audio sample discrepancy calculation section and an audio sample adjustment section. As a result, digital audio signal can be reproduced without requiring synchronization between the transmitter-side clock signal and the receiver-side clock signal.

A receiver which is compatible with Eureka 147 DAB system can be realized by implementing a demodulator in the form of an orthogonal frequency division multiplex demodulator for performing a fast Fourier transform, and implementing a transfer path characteristics calculator in the form of a channel impulse response calculator for generating a power characteristics signal for the channel impulse response as a transfer path characteristics signal.

Furthermore, by ensuring that a frame processing start position is located at a predetermined position within a guard interval of a null symbol, it becomes possible to prevent any delayed reflected waves from exerting unwanted influences on the demodulation of a subsequent transfer frame.

Thus, the invention described herein makes possible the advantage of providing a digital audio broadcasting receiver incorporating an oscillator for oscillation at a fixed frequency, which is capable of controlling an OFDM processing position so as to prevent intersymbol interference due to reflected waves, and which is capable of compensating for audio sample mismatching due to any mismatch between the clock signal on the transmitter-side and the clock signal on the receiver-side, so that audio data can be stably reproduced.

This and other advantages of the present invention will become apparent to those skilled in the art upon reading and understanding the following detailed description with reference to the accompanying figures.

DESCRIPTION OF THE PREFERRED EMBODIMENTS

Hereinafter, the present invention will be described by way of examples, with reference to the accompanying figures.

Figure 1:
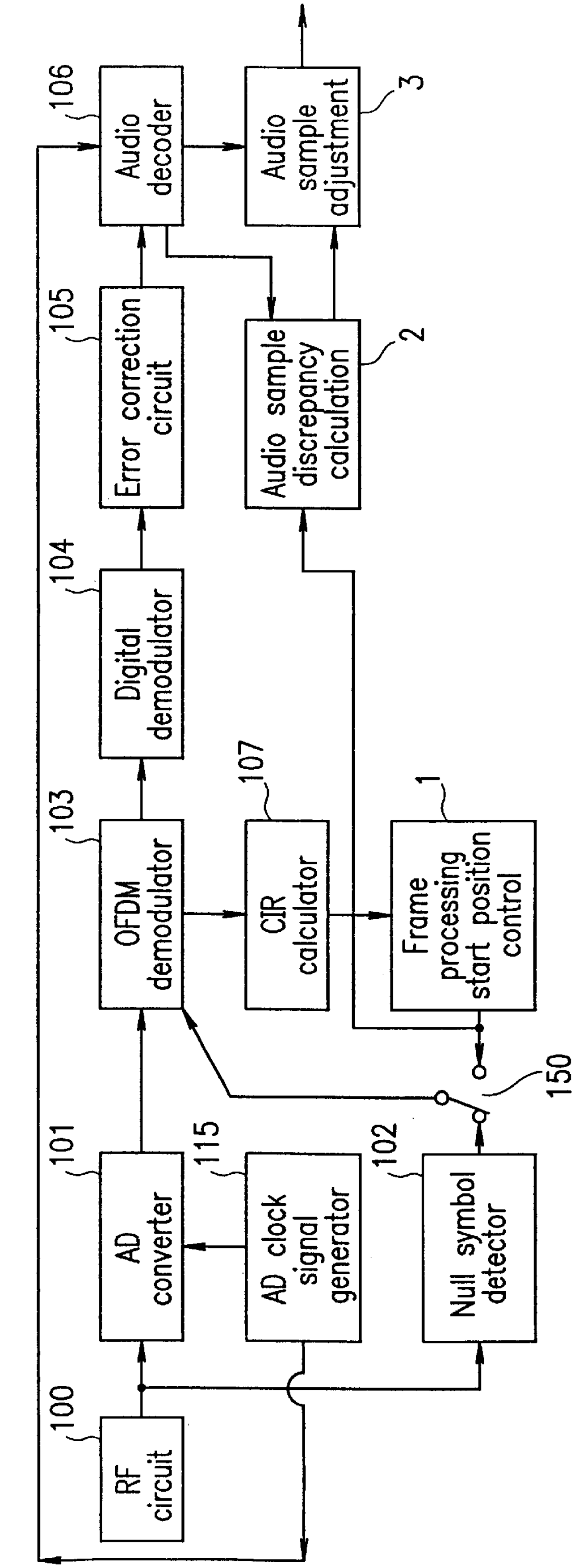
FIG. 1 is a block diagram illustrating the structure of a digital audio broadcasting receiver according to the present invention.

FIG. 1 illustrates the structure of a digital audio broadcasting receiver 1000 according to one example of the present invention.

Figure 10:
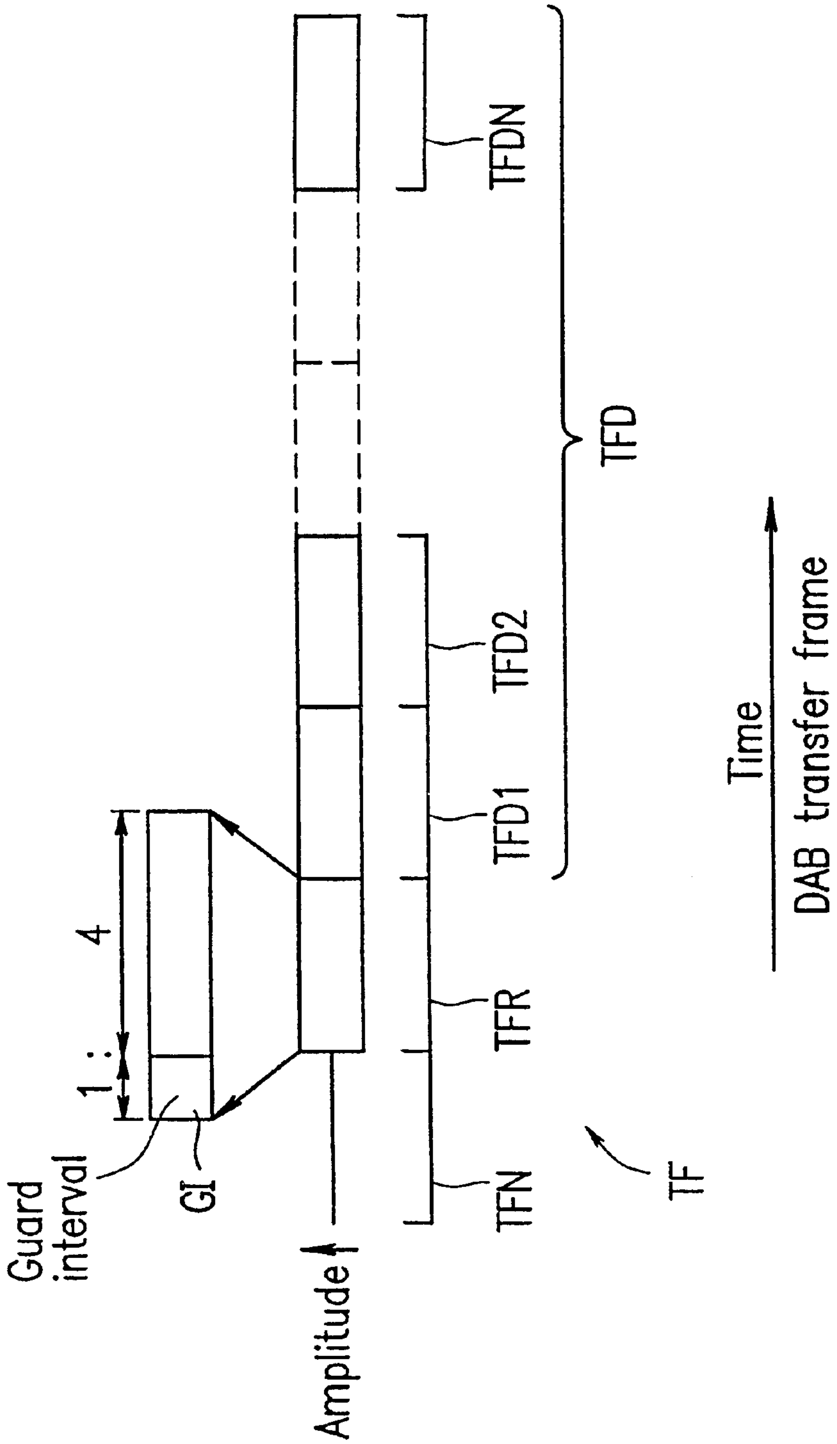
FIG. 10 RELATED ART
FIG. 10 is a diagram illustrating the structure of a DAB transfer frame for Eureka 147 DAB.
Figure 11:
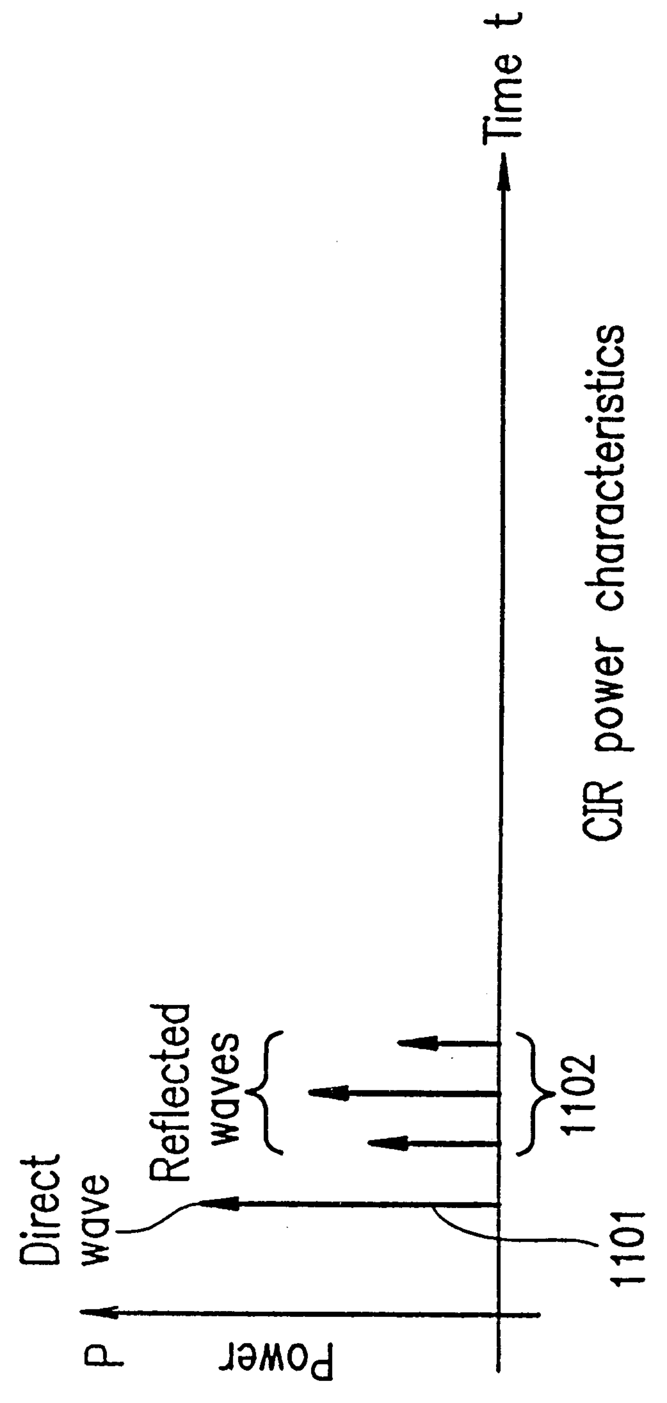
FIG. 11 RELATED ART
FIG. 11 is a graph illustrating exemplary CIR power characteristics.

The present example illustrates a digital audio broadcasting receiver for use in DAB-compatible communications based on the OFDM (orthogonal frequency division multiplex) method. As shown in FIG. 10, each one of a plurality of transfer frames TF to be received includes: a null symbol which has a very low signal level for indicating the start position of a transfer frame TF; a reference symbol TFR containing known information; and a plurality of data symbols TFD which represent data for transfer. Each symbol (TFN, TFR, TFD) has a guard interval (GI) for minimizing intersymbol interference due to reflected waves 1102 (FIG. 11).

Figure 9:
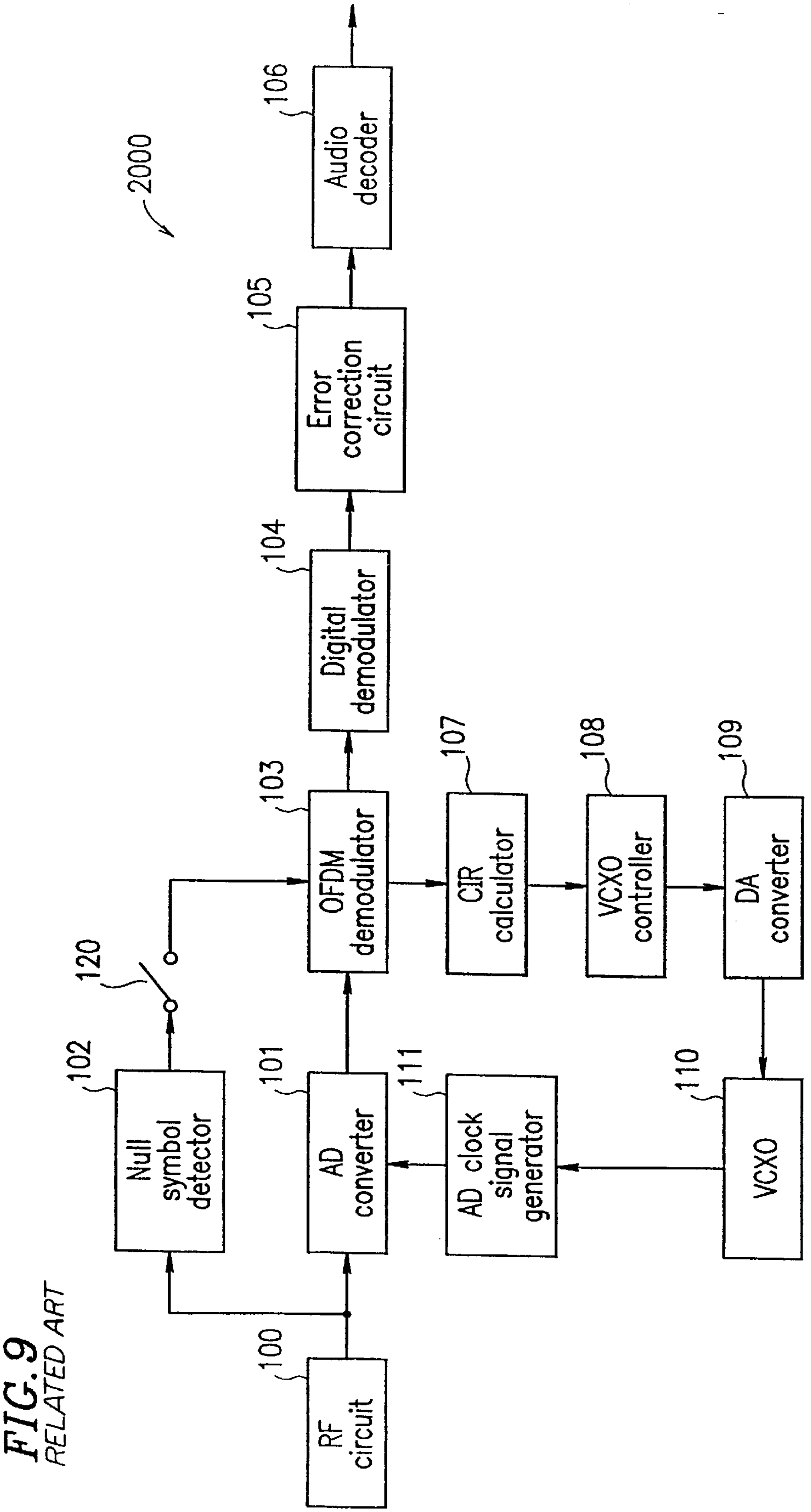
FIG. 9 RELATED ART
FIG. 9 is a block diagram illustrating the structure of a conventional digital audio broadcasting receiver.

As shown in FIG. 1, the digital audio broadcasting receiver 1000 includes an RF circuit 100; an analog-digital (AD) converter 101; a null symbol detector 102; an OFDM demodulator 103; a digital demodulator 104; an error correction circuit 105; an audio decoder 106; and a CIR calculator 107. These constituent elements may be identical with their corresponding elements in the conventional digital audio broadcasting receiver 2000, which has been described with reference to FIG. 9.

The RF circuit 100 converts a radiofrequency signal received from a digital audio broadcast transmitter (not shown) into an analog base band signal. The AD converter 101 converts the analog base band signal into a digital base band signal via sampling based on a clock signal from an AD clock signal generator 115. The null symbol detector 102 detects a null symbol from the power envelope of the analog base band signal from the RF circuit 100, and outputs a null symbol detection signal via a switch 150 which maybe controlled by a CPU (not shown), thereby determining a position at which to start frame processing for the first transfer frame in the OFDM demodulator 103, i.e., the transfer frame received when reception is begun. For the first transfer frame, the OFDM demodulator 103 starts a fast Fourier transform (FFT) from the position (hereinafter referred to as "frame processing start position") at which to start frame processing which has been determined based on the null symbol detection signal from the null symbol detector 102. Out of the digital base band signal which is output from the AD converter 101, the OFDM demodulator 103 sequentially extracts, with a predetermined symbol cycle, a predetermined number of samples of null symbols TFN, reference symbols TFR, and data symbols TFD, starting from the frame processing start position, and sequentially applies FFT thereto. Thus, the respective symbols TFN, TFR and TFD are converted into frequency signals. The digital demodulator 104 subjects the output from the OFDM demodulator 103 to a $\pi/4$ shift DQPSK (differential quadriphase phase shift keying) demodulation. The error correction circuit 105 performs error correction for the output of the digital demodulator 104, and outputs data which is based on a data symbol for generating audio samples. From the output of the error correction circuit 105, the audio decoder 106 extracts audio data which has been compressed on the transmitter side and expands the audio data into a PCM signal so as to generate audio samples based on a clock signal generated from the AD clock signal generator 115, and outputs audio data which contains the audio samples.

The reference symbol TFR, which has been subjected to FFT by the OFDM demodulator 103 and converted into a frequency signal, is sent to the CIR calculator 107. In the CIR calculator 107, the reference symbol TFR is multiplied by a conjugate complex number of a known reference symbol, and its result is subjected to an IFFT (inversion fast Fourier transform), whereby the channel impulse response (CIR), which represents the transfer path characteristics along the time axis, is calculated. By calculating the CIR power characteristics, the temporal relationships between a plurality of received waves, e.g., a direct wave 1101 and reflected waves 1102, can be known.

The digital audio broadcasting receiver 1000 includes the AD clock signal generator 115, which is a clock signal generator capable of oscillating at a fixed frequency. The AD clock signal generator 115 generates a fixed clock signal as a sampling clock for the AD converter 101. Thus, according to the present example, the AD converter 101 performs sampling for each transfer frame TF based on a clock signal having a fixed frequency.

The digital audio broadcasting receiver 1000 further includes a frame processing start position control section 1. By utilizing the channel impulse response (CIR) representing the transfer path characteristics along the time axis, which has been calculated by the CIR calculator 107, the frame processing start position control section 1 controls an extracted portion to be subjected to FFT (i.e., the frame processing start position for OFDM demodulation) of a null symbol TFN that is located at the beginning of a transfer frame TF which lies subsequent to the first transfer frame TF. Preferably, such control is made based on the sampling cycle of the AD converter 101. Thus, the frame processing start position control section 1 is incorporated so as to minimize the intersymbol interference between symbols (TFN, TFR, and TFD) which are sequentially transmitted over time.

As seen from the above description, so far as the first transfer frame TF (i.e., one which exists at the beginning of reception) is concerned, both the inventive digital audio broadcasting receiver 1000 and the conventional digital audio broadcasting receiver 2000 control the portion to be extracted for FFT by the OFDM demodulator 103 on the basis of a null symbol detection signal from the null symbol detector 102. However, for any subsequent transfer frame TF, the inventive digital audio broadcasting receiver 1000 operates differently from the conventional digital audio broadcasting receiver 2000 in that the conventional digital audio broadcasting receiver 2000 controls the portion to be extracted for FFT by the OFDM demodulator 103 by varying the clock frequency of a VCXO, whereas the inventive digital audio broadcasting receiver 1000 directly controls the position at which to start FFT for the null symbol TFN.

Next, the frame processing start position control section 1 will be described in detail with reference to FIG. 2. For conciseness, the following description will primarily be directed to the case where there is only one impulse in the CIR power characteristics, i.e., where only the direct wave 1101 is received. However, it will be appreciated that, by employing, e.g., the conventional method of utilizing the center of gravity among these impulses, the following description will similarly apply to the case where a number of impulses are present that correspond to the direct wave and reflected wave(s).

Figure 2:
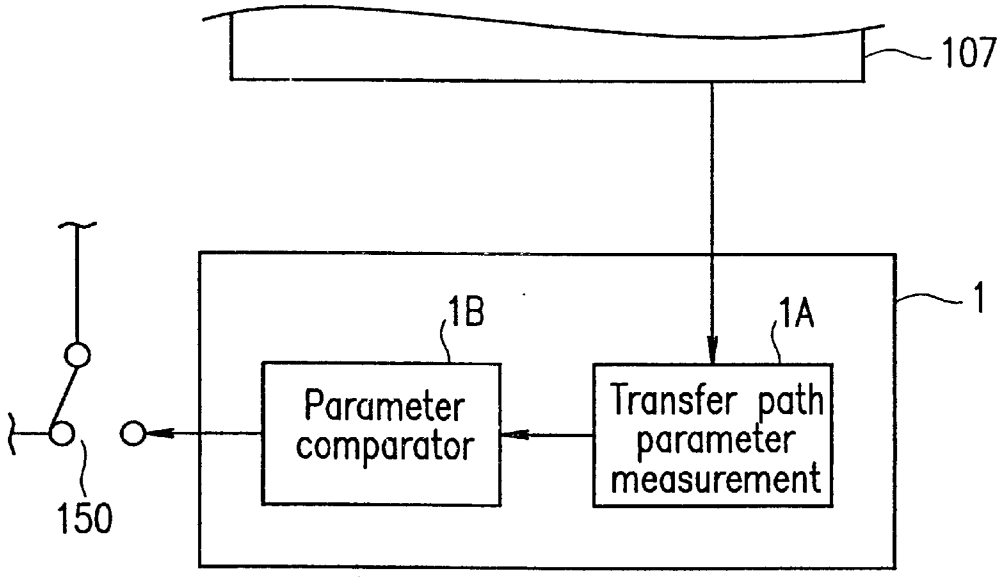
FIG. 2 is a block diagram illustrating the structure of a frame processing start position control section in a digital audio broadcasting receiver according to the present invention.

As shown in FIG. 2, the frame processing start position control section 1 includes a parameter measurement section 1A for measuring a transfer path parameter which is selected depending on the transfer path characteristics based on the CIR power characteristics which are output from the CIR calculator 107. For example, the transfer path parameter may be a time parameter indicating the duration over which an impulse having the highest power (maximum impulse), which is usually the direct wave 1101, is generated. Alternatively, the transfer path parameter may be the position of the center of gravity along the time axis as determined from the impulses corresponding to the direct wave 1101 and the reflected wave(s) 1102.

The transfer path parameter which has been measured by the transfer path parameter measurement section 1A is output to a parameter comparator 1B, where a difference between the transfer path parameter and a predetermined target is measured. The predetermined target is a reference parameter concerning the CIR power characteristics which is previously stored in the parameter comparator 1B. For example, in the case where the transfer path parameter is a time parameter indicating the duration over which the maximum impulse is generated, the predetermined target can may be a point in time which represents a center of a guard interval GI of a null symbol TFN. In this case, coincidence between the transfer path parameter and the predetermined target would indicate that the maximum impulse occurs in the center of the guard interval GI of the null symbol TFN along the time axis; on the other hand, an offset between the transfer path parameter and the predetermined target would indicate that the maximum impulse occurs in a position which is offset from the center of the guard interval GI of the null symbol TFN along the time axis. Thereafter, a position control signal which is based on the difference between the transfer path parameter and the predetermined target as measured by the parameter comparator 1B is output to the OFDM demodulator 103 via the switch 150 so that the frame processing start position for the subsequent transfer frame TF is controlled.

Hereinafter, the control for the frame processing start position for the subsequent transfer frame TF will be described in detail.

First, it will be described how the CIR power characteristics (which represent the transfer path characteristics) may vary in the case where the clock signal on the receiver-side is mismatched with respect to the clock signal on the transmitter-side. In accordance with the digital audio broadcasting receiver 1000, the AD converter 101 sequentially generates samples with a sampling cycle which is based on the clock signal from the fixed-frequency AD clock signal generator 115. For the first transfer frame TF, the OFDM demodulator 103 demodulates the respective symbols (TFN, TFR, and TFD) by extracting a predetermined number of samples which have been thus sampled from a frame processing start position which is based on a null symbol detection signal from the null symbol detector 102, and applying FFT thereto. However, for any subsequent transfer frame TF, the OFDM demodulator 103 demodulates the respective symbols (TFN, TFR, and TFD) by extracting the aforementioned samples from a frame processing start position that has been determined based on a DAB transfer frame length (which is inferred on the receiver side) and applying FFT thereto. The DAB transfer frame length is inferred by the digital audio broadcasting receiver 1000 as "predetermined sample number×sampling cycle (sampling clock)".

Figure 3A:
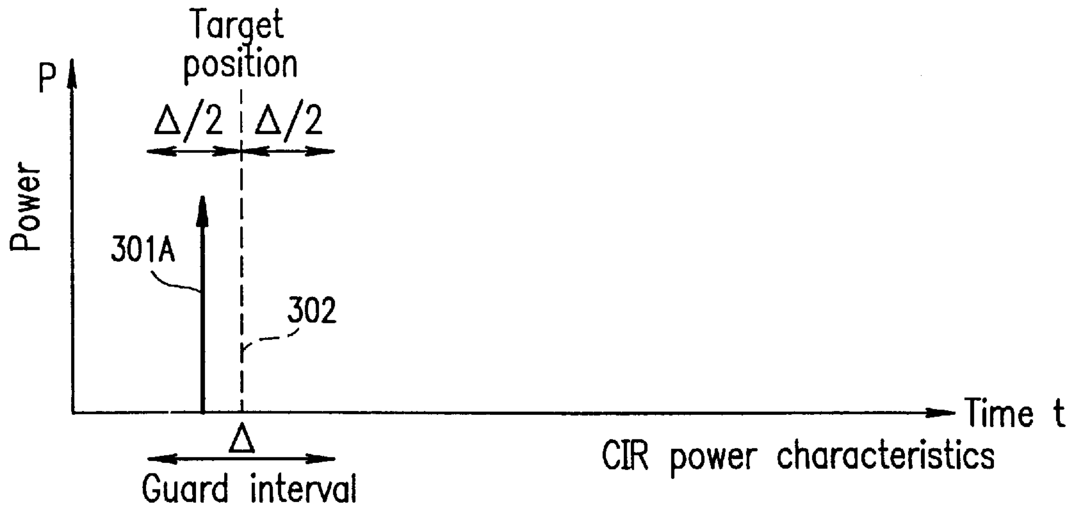
FIG. 3A is a graph illustrating the relationship between CIR power characteristics and mismatching between a transmitter-side clock signal and a receiver-side clock signal.

Accordingly, if the receiver-side clock signal (i.e., the clock signal output from the AD clock signal generator 115) is slower than the transmitter-side clock signal, the DAB frame length on the receiver side, which is inferred based on the sampling clock for the AD converter 101 as described above, becomes longer than the DAB transfer frame length on the transmitter side. In this case, the portion extracted for the FFT for the subsequent transfer frame TF lags behind that for the previous transfer frame TF. As a result, as shown in FIG. 3A, the position of the impulse 301A in the CIR power characteristics is offset forward with respect to the target position 302 (i.e., center of the guard interval GI).

The frame processing start position control section 1 measures this difference in the parameter comparator 1B, based on which the frame processing start position control section 1 outputs a position control signal to the OFDM demodulator 103 via the switch 150 for ensuring that the frame processing start position for the subsequent transfer frame TF is adjusted forward so that the position of the impulse 301A of the CIR power characteristics coincides with the target position 302 (i.e., center of the guard interval GI) in the subsequent transfer frame TF. In other words, the position control signal is a signal which represents an offset along the time axis to be compensated for, as determined based on the mismatching between the transmitter-side and receiver-side clock signals. Therefore, the position control signal may be, for example, a signal representing the amount of time to be compensated for in terms of a number of sampling cycles for the AD converter 101, or alternatively, a signal representing the number of samples to be compensated for as obtained by converting the amount of time for compensation into a number of samples (i.e., divided by the sampling cycle).

Figure 3B:
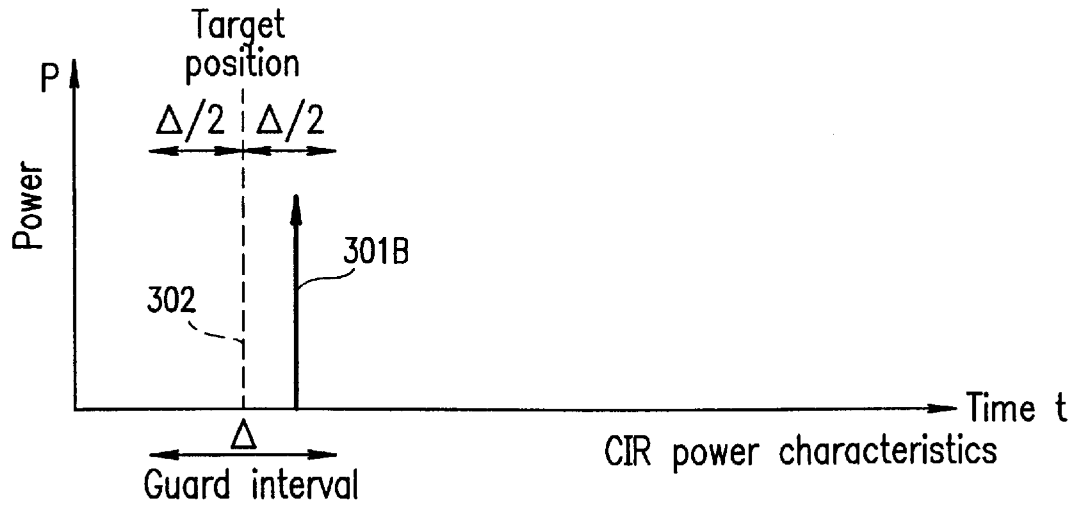
FIG. 3B is a graph illustrating the relationship between CIR power characteristics and mismatching between a transmitter-side clock signal and a receiver-side clock signal.

Conversely, if the receiver-side clock signal is faster than the transmitter-side clock signal, the DAB frame length on the receiver side, which is inferred by the digital audio broadcasting receiver 1000 as described above, becomes shorter than the DAB transfer frame length on the transmitter side. In this case, the portion which is extracted for the FFT for the subsequent transfer frame TF is located earlier than that for the previous transfer frame TF. As a result, as shown in FIG. 3B, the position of the impulse 301B in the CIR power characteristics is offset behind the target position 302 (i.e., center of the guard interval GI). Therefore, the frame processing start position control section 1 controls the OFDM demodulator 103 so as to ensure that a later portion will be extracted for FFT. In practice, the presence of reflected waves 1102 may require certain precaution; that is, the extraction portion may be controlled so that the maximum impulse of the CIR power characteristics coincides with the target position, or the center of gravity of the CIR power coincides with the target position (as practiced in the prior art), whereby the intersymbol interference due to the reflected waves 1102 can be minimized. By setting the target position at the center of the guard interval GI of the null symbol TFN, at least those delayed waves 1102 which are within ½ of the guard interval length are prevented from interfering with the subsequent transfer frame TF.

As described above, by directly controlling the portion to be extracted for FFT from the null symbol TFN of a transfer frame TF, it becomes possible to ensure that the OFDM demodulator 103 extracts portions of the respective symbols (TFN, TFR, and TFD) for FFT so as to minimize the intersymbol interference due to the reflected waves 1102 even if the receiver-side clock signal is mismatched with respect to the transmitter-side clock signal.

Thus, according to the present example, it is possible to successfully demodulate the respective symbols (TFN, TFR, and TFD) while minimizing intersymbol interference due to the reflected waves 1102, in spite of using a fixed-frequency clock signal. Nonetheless, the receiver-side clock signal is still out of synchronization with the transmitter-side clock signal. Therefore, generating audio samples based on data symbols by employing a method similar to that adopted in the conventional digital audio broadcasting receiver 2000 incorporating a clock signal synchronization means will result in a discrepancy between the number of audio samples on the transmitter side and the number of audio samples on the receiver side, so that the reproduced sound may be disrupted, or some sound may fail to be reproduced. Accordingly, in order to compensate for such a discrepancy in the audio sample numbers, the digital audio broadcasting receiver 1000 according to the present example further includes an audio sample discrepancy calculation section 2 and an audio sample adjustment section 3.

Hereinafter, compensation for discrepancy in audio samples due to mismatching between the clock signals on the receiver-side and the transmitter-side by means of the audio sample discrepancy calculation section 2 and the audio sample adjustment section 3 according to the present example will be described in detail.

The audio sample discrepancy calculation section 2 converts the position control signal which is output from the frame processing start position control section 1 into an audio sample discrepancy amount between the receiver-side and the transmitter-side. As mentioned above, the position control signal may be a signal representing an offset along the time axis between the receiver-side and the transmitter-side in terms of a number of sampling cycles for the AD converter 101, for example. In such cases, the position control signal can be regarded as a representation of discrepancy in the number of samples generated by the AD converter 101. Based on the audio sample discrepancy amount which has been calculated by the audio sample discrepancy calculation section 2, the audio sample adjustment section 3 inserts or deletes the audio sample discrepancy amount into or from the audio data containing audio samples which has been expanded into a PCM signal and output from the audio decoder 106. Thus, the audio sample adjustment section 3 outputs audio reproduction data which has been adjusted so as to compensate for the discrepancy in the audio sample numbers between the receiver side and the transmitter side.

Hereinafter, the operations of the audio sample discrepancy calculation section 2 and the audio sample adjustment section 3 will be described in detail.

Figure 4:
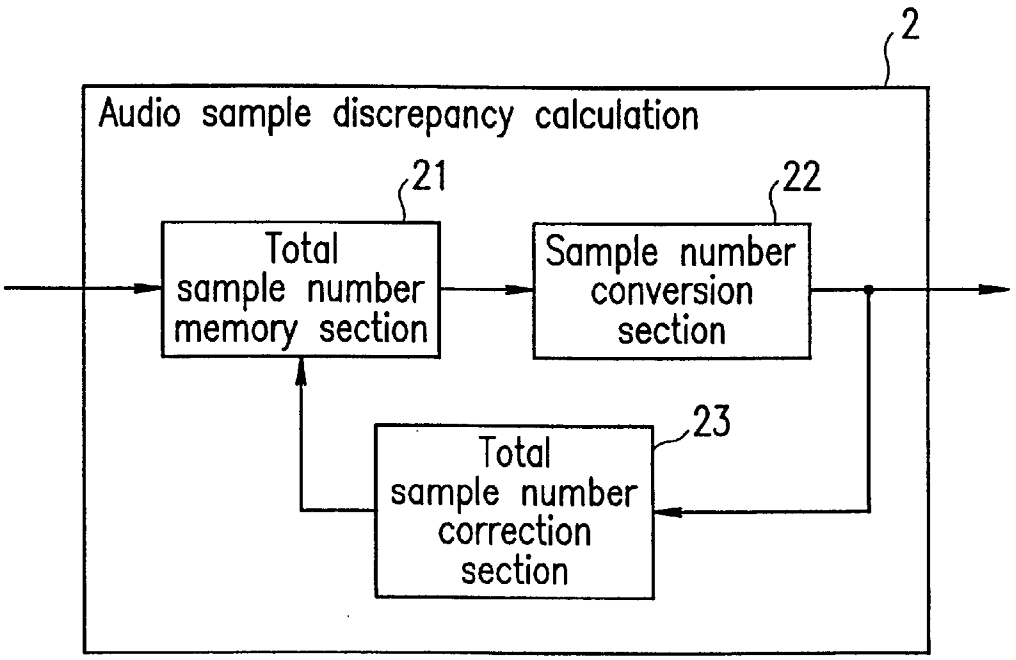
FIG. 4 is a block diagram illustrating the structure of an audio sample discrepancy calculation section in a digital audio broadcasting receiver according to the present invention.

FIG. 4 illustrates the details of the audio sample discrepancy calculation section 2. As described earlier, if the receiver-side clock signal is slower than the transmitter-side clock signal, then the frame processing start position control section 1 outputs a position control signal (as a number of sampling cycles for the AD converter 101 or as a number of samples) to the OFDM demodulator 103 for ensuring that an earlier portion of the null symbol TFN is extracted. The position control signal may indicate a positive number of samples for controlling so that an earlier portion of the null symbol TFN is extracted, and a negative number of samples for controlling so that a later portion of the null symbol TFN is extracted (i.e., when the receiver-side clock signal is faster than the transmitter-side clock). Then, the total number of samples which have been subjected to adjustment for each transfer frame is calculated and stored by a total sample number memory section 21. If the total number of samples stored in the total sample number memory section 21 has a negative value, then the receiver-side clock signal is slower, so the aforementioned audio sample discrepancy amount is deleted from the audio data containing audio samples. If the total number of samples stored in the total sample number memory section 21 has a positive value, then the receiver-side clock signal is faster, so the aforementioned audio sample discrepancy amount is inserted into the audio data containing audio samples.

A sample number conversion section 22 converts the sample number which is stored in the total sample number memory section 21 into a corresponding audio sample number. This operation will be described in reference to the case where the audio output sampling frequency is 48 kHz and the AD converter 101 has a sampling frequency of 2048 kHz. In this case, the audio sampling cycle is 1/48 kHz, and the sampling cycle of the AD converter 101 which is stored in the total sample number memory section 21 is 1/2048 kHz. Therefore, one audio sample is equivalent to 42.666 . . . samples to be processed by the AD converter 101 (i.e., 1/48 kHz÷1/2048 kHz=42.666 . . . ). Preferably, the sample number conversion section 22 converts the sample number ("128") stored in the total sample number memory section 21 into an audio sample number ("3") so as to perform sample number conversion between integers, rather than applying a conversion rate whose value includes subdecimal digits. Accurate conversion can be attained in this manner as described below.

For example, if the sample number which is stored in the total sample number memory section 21 exceeds 128 and reaches 130, then the sample number conversion section 22 outputs "3" as an audio sample discrepancy amount. Then, a total sample number correction section 23 back-calculates "3" audio samples (which is the output of the sample number conversion section 22) into "128" samples (as the number of sample numbers for AD conversion), and subtracts "128" from the value stored in the total sample number memory section 21. As a result, "2" (=130−128) samples is stored in the total sample number memory section 21 at this point. Thereafter, sample numbers based on the position control signal representing an offset in the subsequent transfer frame TF will be sequentially added to the "2" samples stored in the total sample number memory section 21. Thus, the entirety of transfer frames which are sequentially processed can receive accurate sample discrepancy compensation.

If the number of samples which is stored in the total sample number memory section 21 is "−130", the same operation as in the case where "130" is stored in the total sample number memory section 21 except that the signs of the respective values are reversed. Specifically, the sample number conversion section 22 outputs "−3" as an audio sample discrepancy amount. Then, the total sample number correction section 23 back-calculates "−2" audio samples into "−128" samples as the number of sample numbers for AD conversion, and subtracts "−128" from the value stored in the total sample number memory section 21. As a result, "−2" (=(−130)−(−128)) samples is stored in the total sample number memory section 21 at this point.

In the example illustrated above, audio samples are output for compensation in groups of three, which corresponds to 128 samples to be processed by the AD converter 101. However, the audio sample compensation may be performed at an even finer resolution. For example, the audio sample discrepancy calculation section 2 may be arranged so that one audio sample is output every time the number of samples stored in the total sample number memory section 21 reaches "43", "86", or "128". In this case, the total sample number correction-section 23 may be arranged so as to subtract "128" from the value stored in the total sample number memory section 21 every time three audio samples have been output.

The audio sample adjustment section 3 generates audio reproduction data to be reproduced, by inserting or deleting the audio sample discrepancy amount calculated by the audio sample discrepancy calculation section 2 into or from the audio data containing audio samples which has been expanded into a PCM signal and output from the audio decoder 106. The audio sample adjustment section 3 may be adapted to realize audio reproduction in a monaural mode, a stereo mode, and/or a multi-channel mode. The audio sample adjustment section 3 can be composed of a desired number of channels as required by these modes of communications.

Figure 5:
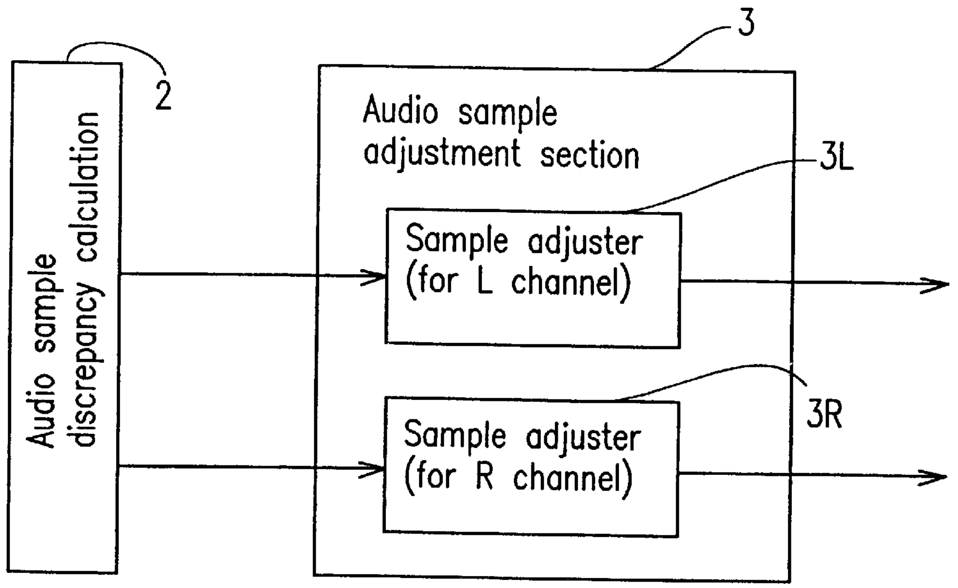
FIG. 5 is a block diagram illustrating the structure of an audio sample adjustment section in a digital audio broadcasting receiver according to the present invention.
Figure 6:
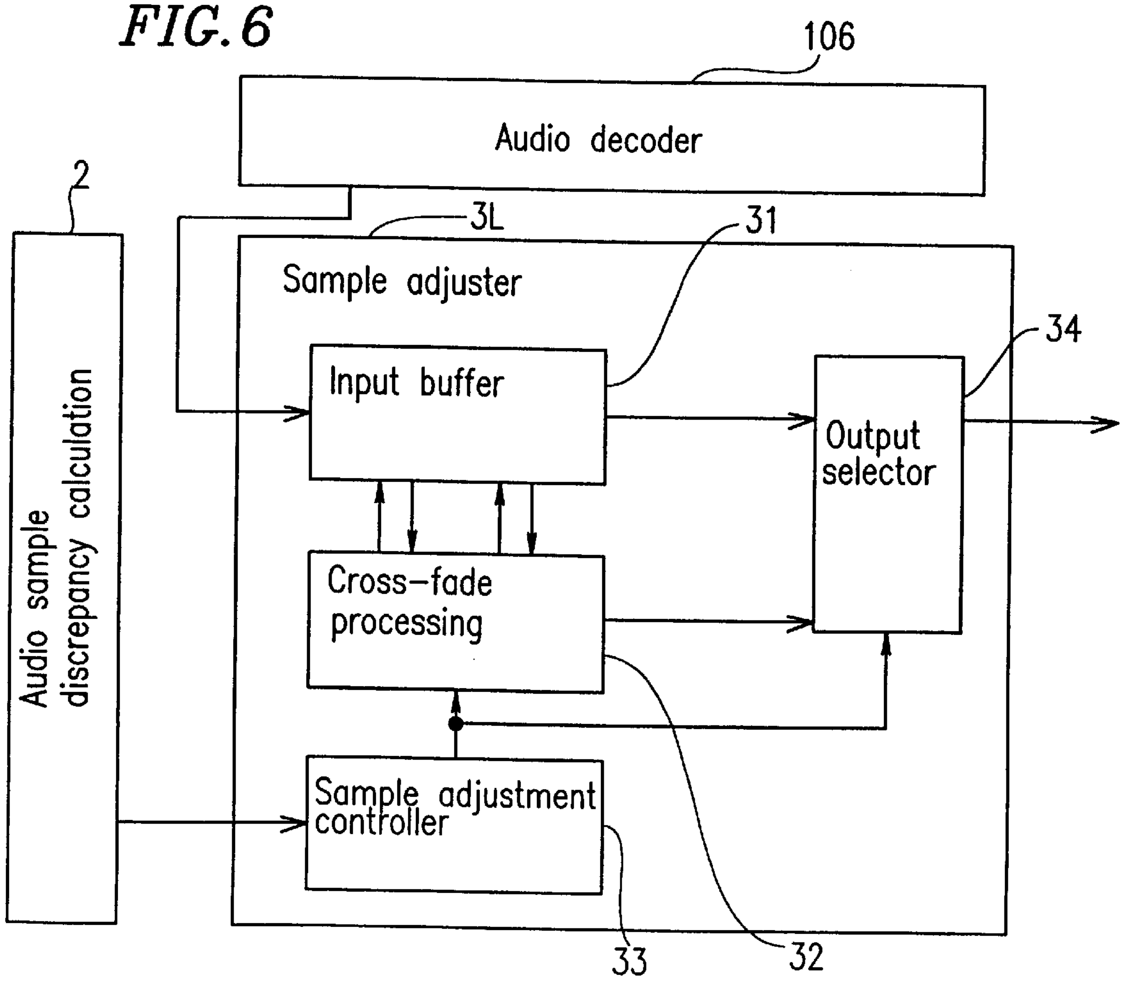
FIG. 6 is a block diagram illustrating the structure of sample adjusters in a digital audio broadcasting receiver according to the present invention.

FIG. 5 illustrates an exemplary structure of the audio sample adjustment section 3 for stereo reproduction, where sample adjusters 3L and 3R are provided for the L channel and the R channel, respectively. FIG. 6 is a diagram illustrating the sample adjuster 3L in detail. A predetermined number (N) of audio samples in the audio data which is output from the audio decoder 106 are temporarily stored in an input buffer 31. The number of audio samples to be inserted or deleted every time there is an update of a number of audio samples to be inserted or deleted, which is calculated by the audio sample discrepancy calculation section 2, is input to a sample adjustment controller 33. The sample adjustment controller 33 determines the number of audio samples to be inserted or deleted in one process. As more audio samples are inserted or deleted in a single process, the resultant audio reproduction data becomes more distorted. Therefore, according to the present example, one audio sample is inserted or deleted in one process. If a plurality of audio samples are to be inserted or deleted, they are preferably processed at predetermined intervals rather than being processed simultaneously. For example, in the case of Eureka 147 DAB, which adopts MPEG I layer2, the sample adjustment controller 33 controls the process so that one audio sample is inserted or deleted for every 24 ms, which corresponds to the audio frame cycle. Thus, by controlling the processing for a plurality of audio samples so that one audio sample is inserted or deleted at each discrete time with predetermined time intervals therebetween (e.g., 1 audio frame cycle), it becomes possible to obtain audio reproduction data with minimum distortion. Responsive to a control signal from the sample adjustment controller 33, an output selector 34 selectively outputs either the output from the input buffer 31 or the output from a cross-fade processing section 32 to an audio reproducer (not shown) as the audio reproduction data to be reproduced. The audio reproducer (not shown) reproduces sounds in accordance with the audio reproduction data. In the case where the sample adjustment controller 33 performs control for inserting or deleting audio samples, the compensated audio data from the cross-fade processing section 32 is selected as the audio reproduction data output. In the case where the sample adjustment controller 33 does not insert or delete audio samples, the audio data from the input buffer 31 is selected as the audio reproduction data output.

Next, the cross-fade processing section 32 for inserting or deleting audio samples and generating audio reproduction data will be described with reference to FIG. 7. The cross-fade processing section 32 includes an address generator 315, first and second variable gain amplifiers 311 and 312, a gain controller 314, and an adder 313 for adding the outputs of the variable gain amplifiers 311 and 312. Hereinafter, the specific operation of the cross-fade processing section 32 will be described. Although the present example illustrates a case where one sample is inserted or deleted into or from PCM audio data, it will be appreciated that a similar process is also applicable to the processing for a plurality of samples.

The address generator 315 outputs an address ADDR1 (where ADDR1=1, 2, 3, . . . , N) for sequentially designating a number (N) of audio samples that are output from the input buffer 31. The address generator 315 generates another address ADDR2 so as to represent an address which is obtained by subtracting the output of the sample controller 33 (i.e., audio sample discrepancy amount) from ADDR1. The address generator 315 finishes the generation of the address when N is output as the address ADDR2. Insertion or deletion of audio samples can be achieved as the outputting of audio samples which are input to the input buffer 31 is completed. Thereafter, similar processes are repeated when new audio samples are input from the audio decoder 106 to the input buffer 31.

The addresses ADDR1 and ADDR2 are input to the input buffer 31, and audio samples S(ADDR1) and S(ADDR2) which correspond to ADDR1 and ADDR2 are output. When ADDR2 is equal to or smaller than 0, zero (0) audio samples are output as the audio sample S(ADDR2). The audio samples S(ADDR1) and S(ADDR2) are input to the first and second gain amplifiers 311 and 312, respectively, where they are respectively multiplied by gains GA1 and GA2 as expressed by (eq. 1), added by the adder 313, and output as the compensated PCM audio data SOUT (i.e., data which has been subjected to sample compensation):

$$SOUT = GA1 \cdot S(ADDR1) + GA2 \cdot S(ADDR2)$$

$$GA2 = 1 - GA1 \qquad \text{(eq. 1)}$$

Figure 8:
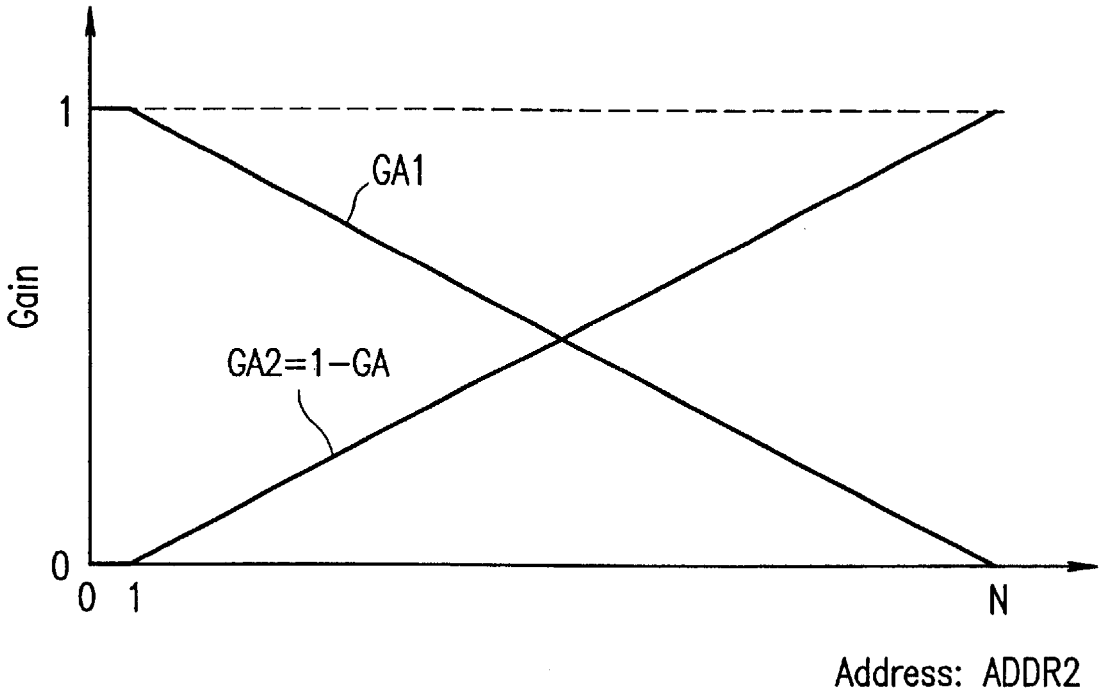
FIG. 8 is a graph illustrating the gain characteristics of variable gain amplifiers with respect to address values provided from an address generator according to the present invention.

The gains GA1 and GA2 of the first and second variable gain amplifiers 311 and 312 are controlled by the gain controller 314 as shown in the graph of FIG. 8. Specifically, the sum of the gains of the first and second variable gain amplifiers 311 and 312 always equals 1. The gain GA1 of the first variable gain amplifier 311 is 1 when ADDR2=0 or 1, after which it gradually decreases until GA1=0 at ADDR2=N. The gain GA2 of the second variable gain amplifier 312 is 0 when ADDR2=0 or 1, after which it gradually increases until GA2=1 at ADDR2=N.

Now, a case will be specifically described where one sample is inserted into the audio data which is output from the audio decoder 106. Referring to FIG. 6, "+1" is input to the cross-fade processing section 32 from the sample adjustment controller 33, and a plurality of PCM audio samples are input to the input buffer 31 from the audio decoder 106.

Figure 7:
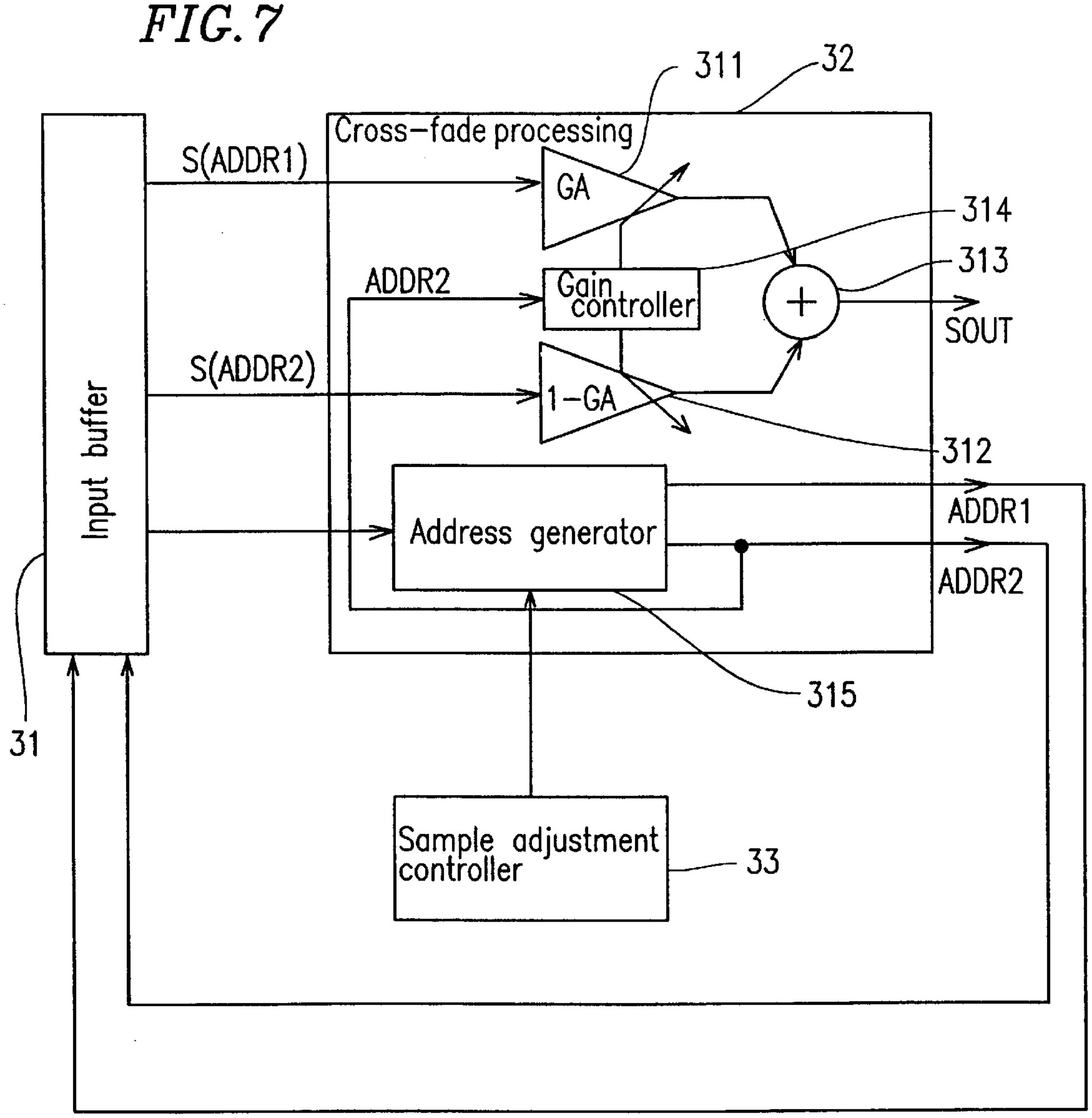
FIG. 7 is a block diagram illustrating the structure of a cross-fade processing section in a digital audio broadcasting receiver according to the present invention.

Referring to FIG. 7, in this case, the address generator 315 first outputs ADDR1=1, and ADDR2=ADDR1−1=0. The gain controller 314 controls the gain GA1 of the first variable gain amplifier 311 to be 1 and the gain GA2 of the second variable gain amplifier 312 to be 0, and the outputs of the two variable gain amplifiers 311 and 312 are added by the adder 313.

Next, ADDR1=2 and ADDR2=1 are output. At this point, the gain GA1 of the first variable gain amplifier 311 is still 1 and the gain GA2 of the second variable gain amplifier 312 is still 0.

When ADDR1=3 and ADDR2=2 are output, the gain GA1 of the first variable gain amplifier 311 is GA1=1−1/N and the gain GA2 of the second variable gain amplifier 312 is GA2=1−GA1=1/N.

The second variable gain amplifier 312 receives a signal which is delayed by one sample behind the signal which is input to the first variable gain amplifier 311. As the values of the addresses ADDR1 and ADDR2 increase, the signal which is input to the first variable gain amplifier 311 and the signal which is input to the second variable gain amplifier 312 (i.e., a signal which is delayed by one sample behind the input signal to the first variable gain amplifier 311) are cross-faded for smooth transition, so that the last ($N+1^{st}$) audio sample which is output by the cross-fade processing section 32 becomes equal to the last ($N^{th}$) audio sample from the input buffer 31. Since the address generator 315 generates the address ADDR2 over N+1 samples (from 0 to N), it will be seen that the audio samples which are output from the audio sample adjustment section 3 have been incremented by 1 sample.

Next, a case will be specifically described where one sample is deleted from the audio data which is output from the audio decoder 106. Referring to FIG. 6, "−1" is input to the cross-fade processing section 32 from the sample adjustment controller 33, and PCM audio output from the audio decoder 106 is input to the input buffer 31.

Referring to FIG. 7, in this case, the address generator 315 first outputs ADDR1=1, and ADDR2=ADDR1−(−1)=2. The gain controller 314 controls the gain GA1 of the first variable gain amplifier 311 to be GA1=1−1/N and the gain GA2 of the second variable gain amplifier 312 to be GA2=1/N, and the outputs of the two variable gain amplifiers 311 and 312 are added by the adder 313.

When ADDR1=2 and ADDR2=3 are output, the gain GA1 of the first variable gain amplifier 311 is GA1=1−2/N and the gain GA2 of the second variable gain amplifier 312 is GA2=1−GA1=2/N.

The second variable gain amplifier 312 receives a signal which is advanced by one sample with respect to the signal which is input to the first variable gain amplifier 311. As the values of the addresses ADDR1 and ADDR2 increase, the signal which is input to the first variable gain amplifier 311 and the signal which is input to the second variable gain amplifier 312 (i.e., a signal which is advanced by one sample with respect to the input signal to the first variable gain amplifier 311) are cross-faded for smooth transition, so that the last ($N-1^{st}$) audio sample which is output by the cross-fade processing section 32 becomes equal to the last ($N^{th}$) audio sample from the input buffer 31. Since the address generator 315 generates the address ADDR2 over N−1 samples (from 2 to N), it will be seen that the audio samples which are output from the audio sample adjustment section 3 have been decremented by 1 sample.

Thus, according to the present example, the gain controller controls the gain GA1 of the first variable gain amplifier 311 so as to take a large value first and then gradually decrease, and controls the gain GA2 of the second variable gain amplifier 312 so as to take a small value first and then gradually increase.

Thus sample compensation can be achieved with minimum distortion by the cross-fading action of the cross-fade processing section 32 for inserting or deleting one sample over a plurality of samples. The cross-fading preferably occurs over a period of at least 2 ms. Accordingly, in the case where the sampling frequency for audio samples is 48 kHz, the number (N) of samples to be thus cross-faded is preferably 96 or more. If multiple samples are received from the audio sample discrepancy calculation section 2 for insertion or deletion, the insertion or deletion of such multiple samples can be attained by controlling the cross-fade processing section 32 so as to insert or delete one sample over a predetermined period of 24 ms, for example, which corresponds to the MPEG audio frame cycle.

Thus, according to the present invention, it is possible to reproduce audio reproduction data which has been smoothed out through insertion or deletion of audio samples. Therefore, according to the aforementioned example, audio data can be satisfactorily reproduced even in the case where the transmission-side clock signal is mismatched with respect to the receiver-side clock signal. In preferable embodiments, the reproduced sounds are in accordance with the transmitted audio data so that any disruption or failure of reproduction therein are prevented.

More specifically, by employing the digital audio broadcasting receiver according to the aforementioned example, mismatching in audio signals due to clock deviation between the transmitter-side and the receiver-side can be compensated for during MPEG audio reproduction in a digital transfer based on the OFDM transfer method. As a result, stable audio reproduction free from momentary disruptions can be achieved.

Although the aforementioned example illustrates a digital audio broadcasting receiver for use in communications based on the OFDM method, e.g., DAB, the digital audio broadcasting receiver according to the present invention can also be used as a receiver for communications systems based on any other communications method. For example, the digital audio broadcasting receiver according to the present invention may be suitably employed in a communications method where transfer frames at least include guard regions for forestalling reflected waves and where it is desirable to digitalize analog signals through sampling with a predetermined clock frequency, etc.

As described above, in accordance with the digital audio broadcasting receiver of the present invention, a fixed-frequency oscillator can be employed and yet it is possible to minimize intersymbol interference by controlling the frame processing start position based on a signal representing the transfer path characteristics, and it is possible to stably reproduce audio reproduction data by compensating for audio sample discrepancies due to mismatching in the frequencies of the clock signals on the transmitter-side and the receiver-side by using a total value of adjusted sample numbers. As a result, satisfactory sound reproduction can be attained.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. A digital audio broadcasting receiver for receiving a plurality of transfer frames comprising a first transfer frame and a second transfer frame subsequent to the first transfer frame, each of the plurality of transfer frames containing a null symbol representing a start position of each transfer frame, a reference symbol representing known information, and a data symbol representing data to be transferred, wherein each of the null symbol, the reference symbol, and the data symbol includes a guard interval for preventing intersymbol interference due to a reflected wave, wherein the digital audio broadcasting receiver comprises:

an analog-digital converter for converting the plurality of transfer frames from an analog signal format into a digital signal format based on a clock signal having a fixed frequency and for outputting the first transfer frame;

a demodulator for demodulating the first transfer frame from a first frame processing start position for the first transfer frame;

an audio decoder for generating audio data containing a plurality of audio samples based on the data symbol contained in the first transfer frame which has been demodulated by the demodulator;

a transfer path characteristics calculator for generating a transfer path characteristics signal representing transfer path characteristics based on the reference symbol contained in the first transfer frame which has been demodulated by the demodulator;

a frame processing start position control section, which includes the transfer path characteristics calculator, for controlling a second frame processing start position for the second transfer frame, by outputting to the demodulator a position control signal representing a difference between a predetermined frame processing reference start position and the first frame processing start position for the first transfer frame based on the transfer path characteristics signal, so that the second frame processing start position for the second transfer frame coincides with the predetermined frame processing reference start position;

an audio sample discrepancy calculation section for calculating a discrepancy between a plurality of audio samples contained in audio data transmitted by a digital audio transmitter and the plurality of audio samples contained in the audio data generated by the audio decoder based on the position control signal; and an audio sample adjustment section for adjusting the number of audio samples contained in the audio data generated by the audio decoder, based on the audio sample discrepancy, and for selectively outputting audio reproduction data to be reproduced as sound.

2. A digital audio broadcasting receiver according to claim 1, wherein the demodulator comprises an orthogonal frequency division multiplex demodulator for applying fast Fourier transform to the null symbol, the reference symbol, and the data symbol contained in the plurality of transfer frames, and wherein the transfer path characteristics calculator comprises a channel impulse response calculator for generating a channel impulse response power characteristics signal, the channel impulse response power characteristics signal being the transfer path characteristics signal.

3. A digital audio broadcasting receiver according to claim 1, wherein the predetermined frame processing reference start position is a predetermined position within the guard interval of the null symbol.

4. A digital audio broadcasting receiver according to claim 1, wherein the analog-digital converter converts the plurality of transfer frames from an analog signal format into the digital signal format through sampling with a sampling cycle based on the clock signal having the fixed frequency, and wherein the audio sample discrepancy calculation section comprises:

a total sample number memory section for storing a total number of samples which have been sampled by the analog-digital converter with the sampling cycle for a predetermined period, the total number of samples corresponding to a difference between the predetermined frame processing reference start position and the first frame processing start position;

a sample number conversion section for converting at least some of the total number of samples stored in the total sample number memory section into a number of audio samples, whereby the audio sample discrepancy is calculated; and a total sample number correction section for correcting the total number of samples stored in the total sample number memory section by outputting at least some of the total number of samples after having been converted by the sample number conversion section to the total sample number memory section.

5. A digital audio broadcasting receiver according to claim 1, wherein the audio sample adjustment section comprises at least one sample adjuster corresponding to at least one of monaural reproduction, stereo reproduction, and multichannel reproduction, each of the at least one sample adjuster including:

an input buffer for storing a predetermined number of audio samples among the audio samples contained in the audio data generated by the audio decoder;

a cross-fade processing section for reading the predetermined number of audio samples stored in the input buffer, for performing insertion or deletion of the predetermined number of audio samples with cross-fading, and for generating compensated audio data;

a sample adjustment controller for determining a number of audio samples to be inserted or deleted in one process by the cross-fade processing section; and an output selector for selectively outputting the predetermined number of audio samples stored in the input buffer when performing neither insertion nor deletion of audio samples, and selectively outputting the compensated audio data generated by the cross-fade processing section when performing insertion or deletion of audio samples.

6. A digital audio broadcasting receiver according to claim 5, wherein the cross-fade processing section comprises:

a first variable gain amplifier and a second variable gain amplifier;

a gain controller for controlling a gain of the first variable gain amplifier and a gain of the second variable gain amplifier;

an adder for adding outputs of the first variable gain amplifier and the second variable gain amplifier; and an address generator for generating two addresses for audio samples to be input to the first variable gain amplifier and the second variable gain amplifier for insertion or deletion of the number of audio samples determined by the sample adjustment controller, the two addresses being output to the input buffer, and wherein the gain controller controls the gain of the first variable gain amplifier so as to take a large value first and then gradually decrease and controls the gain of the second variable gain amplifier so as to take a small value first and then gradually increase.

7. A digital audio broadcasting receiver claim 5, wherein, when the sample adjustment controller performs insertion or deletion of a plurality of audio samples, the insertion or deletion is performed at a plurality of times, with predetermined time intervals therebetween, so that one audio sample is inserted or deleted each time.

* * * * *

UNITED STATES PATENT AND TRADEMARK OFFICE

CERTIFICATE OF CORRECTION

PATENT NO. : 6,539,065 B1
DATED : March 25, 2003
INVENTOR(S) : Hiroki Furukawa

It is certified that error appears in the above-identified patent and that said Letters Patent is hereby corrected as shown below:

Column 18,
Line 57, after “receiver” -- according to -- should be inserted.

Signed and Sealed this

Twenty-eighth Day of October, 2003

JAMES E. ROGAN
*Director of the United States Patent and Trademark Office*